(12) United States Patent
Stoppe et al.

(10) Patent No.: US 9,797,805 B2
(45) Date of Patent: Oct. 24, 2017

(54) TEST OBJECT FOR MEASURING THE POINT SPREAD FUNCTION OF AN OPTICAL SYSTEM

(71) Applicants: Carl Zeiss SMT GmbH, Oberkochen (DE); Carl Zeiss AG, Oberkochen (DE)

(72) Inventors: Lars Stoppe, Jena (DE); Robert Pomraenke, Dresden (DE); Michael Arnz, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 143 days.

(21) Appl. No.: 14/707,533

(22) Filed: May 8, 2015

(65) Prior Publication Data

US 2015/0355052 A1 Dec. 10, 2015

(30) Foreign Application Priority Data

Jun. 4, 2014 (DE) .................. 10 2014 210 641

(51) Int. Cl.
*G01M 11/02* (2006.01)
*G03F 7/20* (2006.01)

(52) U.S. Cl.
CPC ......... *G01M 11/0264* (2013.01); *G03F 7/706* (2013.01)

(58) Field of Classification Search
None
See application file for complete search history.

(56) References Cited

U.S. PATENT DOCUMENTS

| 7,375,810 | B2 * | 5/2008 | Nikoonahad | ........ G01B 11/272 |
| | | | | 356/399 |
| 2004/0174506 | A1 | 9/2004 | Smith | |
| 2006/0072104 | A1 | 4/2006 | Engel et al. | |
| 2012/0268588 | A1 * | 10/2012 | Eckerl | ........ G01M 11/0207 |
| | | | | 348/135 |

FOREIGN PATENT DOCUMENTS

| DE | 103 27 019 A1 | 12/2004 |
| WO | WO 03/056392 | 7/2003 |

OTHER PUBLICATIONS

German Office Action, with translation thereof, for corresponding DE Appl No. 10 2014 210 641.9, dated May 4, 2015.

* cited by examiner

*Primary Examiner* — Kara E Geisel
*Assistant Examiner* — Amanda Merlino
(74) *Attorney, Agent, or Firm* — Fish & Richardson P.C.

(57) ABSTRACT

A test object for measuring the point spread function (PSF) of an optical system having a given Airy diameter ($d_{Airy}$) comprises a structure to be imaged having a plurality of structure elements to be imaged, wherein the structure elements are embodied and arranged in such a way that the structure has at least two axes of symmetry.

16 Claims, 12 Drawing Sheets

Figure 1:
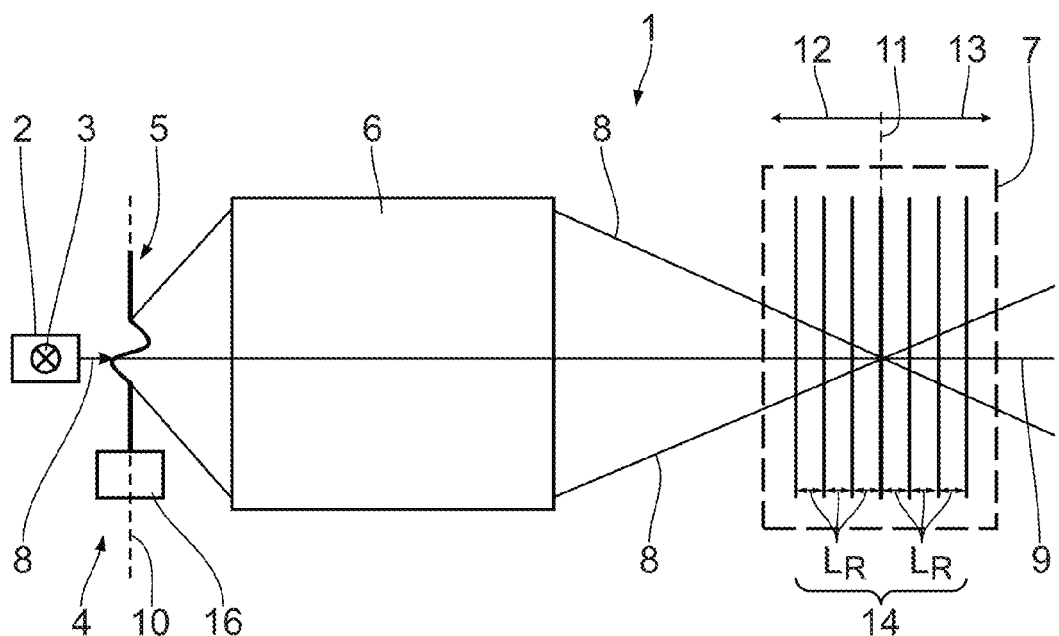

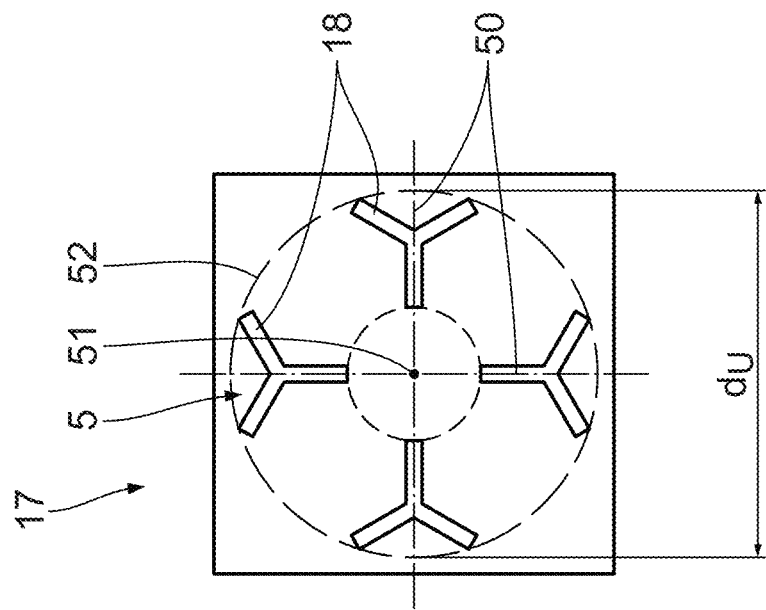
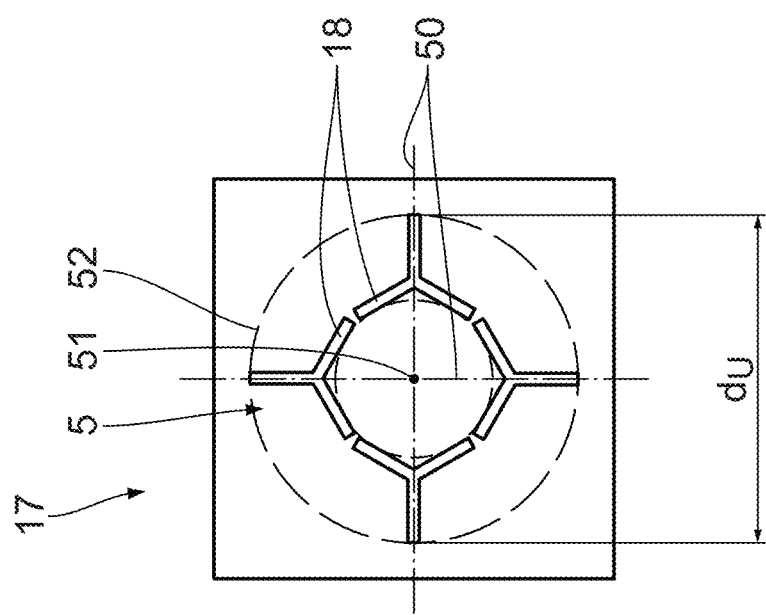

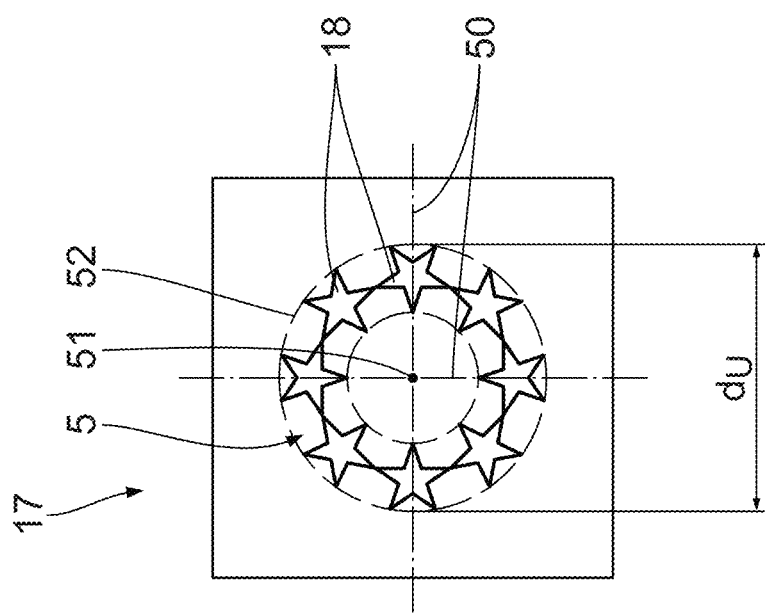

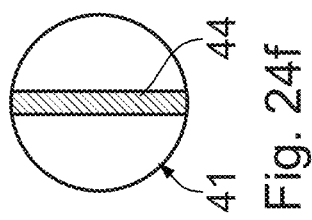
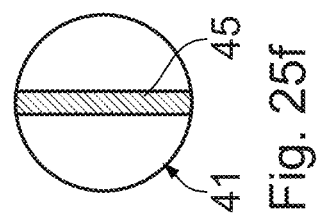
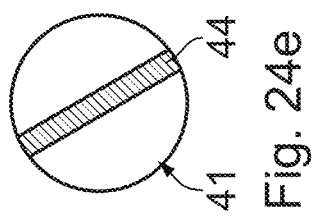
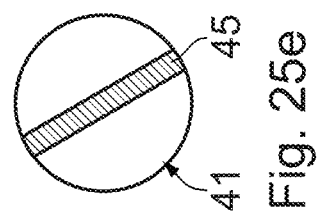
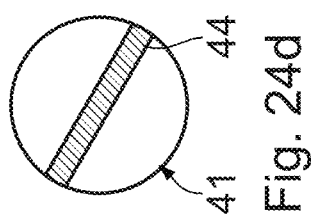
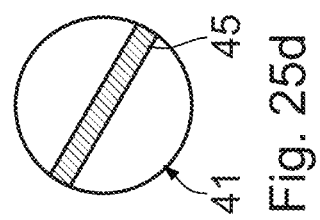
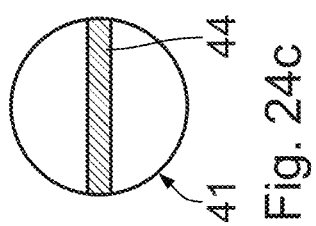
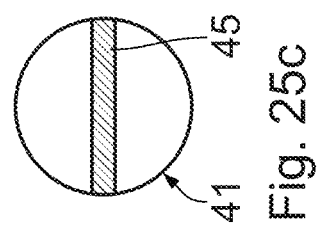
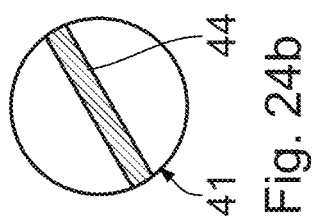
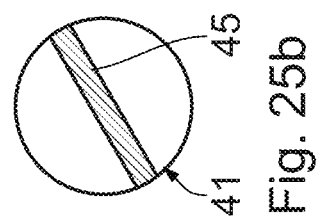
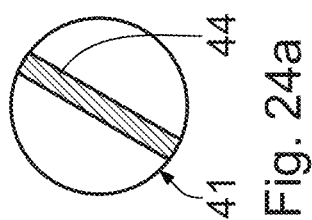
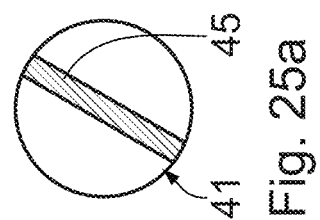

TEST OBJECT FOR MEASURING THE POINT SPREAD FUNCTION OF AN OPTICAL SYSTEM

CROSS-REFERENCE TO RELATED APPLICATIONS

This application claims benefit under 35 U.S.C. §119 to German Application No. 10 2014 210 641.9, filed Jun. 4, 2014, the entire contents of which are hereby incorporated by reference.

The invention relates to a test object for measuring the point spread function of an optical system. The invention furthermore relates to the use of such a test object for measuring the point spread function of an optical system. Moreover, the invention relates to a device for measuring the point spread function of an optical system, and to an optical system comprising such a device. Finally, the invention relates to a method for measuring the point spread function of an optical system.

An assessment of the obtainable imaging quality is required for example in association with the production of high-quality imaging optical units.

A method for determining the imaging quality of an optical imaging system is known from DE 103 27 019 A1.

A problem addressed by the present invention is that of improving a test object for measuring the point spread function, in particular the imaging quality of an optical system, in particular of an imaging optical system.

This problem is solved via a test object comprising a structure to be imaged having a plurality of structure elements to be imaged, wherein the elements are embodied and arranged in such a way that the structure has at least two axes of symmetry. On account of the symmetry properties of the structure to be imaged, it is possible to prevent the structure from inducing specific asymmetrical image aberrations.

It may be advantageous, in particular, for the elements to be embodied and arranged in such a way that the structure has two axes of symmetry which are perpendicular to one another. In this case, the structure has a point symmetry. Generally, the axes of symmetry can also have other angular ratios with respect to one another.

Preferably, the structure has three, four, five, six or more axes of symmetry.

In principle, it is also possible for the structure to have one or a plurality of additional structure elements, in particular in the form of pinholes. The additional structure elements can be embodied and/or arranged in such a way that they have a symmetry breaking effect with regard to the symmetry properties of the abovementioned structure elements. They can also maintain the symmetry properties.

The structure is embodied, in particular, in such a way that it leads to an illumination of the pupil of the optical system for which the Zernike polynomials that are to be used for describing this illumination, in particular the Zernike polynomials of identical type or order that are to be used for describing this illumination, are orthogonal to one another. The achievable accuracy is improved as a result. The structure according to the invention makes it possible, in particular, to ascertain the imaging aberrations of the optical system in a manner broken down according to the respective types, coma, astigmatism, spherical aberration, higher-order coma, etc. This enables a subsequent adjustment of the optical system. The structure is embodied, in particular, in such a way that the Zernike polynomials up to a predefined order, in particular up to the second, third, fourth, fifth, sixth or higher order, are orthogonal to one another. A retrieval method, in particular a phase retrieval, can be improved as a result. As a result, it is possible, in particular, to amplify the effect of asymmetrical aberrations, as a result of which the latter can be ascertained more distinctly in a phase retrieval.

In accordance with one aspect of the invention, the structure elements are embodied and arranged in such a way that the structure has an even-order rotational symmetry. It has, in particular, a rotational symmetry with order of at least two, four, six or eight. This leads to a good separability of the Zernike coefficients.

In accordance with one aspect of the invention, the number of structure elements to be imaged is at least four. It is preferably at least six, eight, ten, twelve, sixteen.

The total transmission of the structure to be imaged can be increased by a larger number of structure elements to be imaged.

The structure elements to be imaged can be embodied such that they are at least partly disconnected. They can also be embodied such that they are disconnected in each case in pairs. They can also be embodied such that they partly overlap.

The structure elements to be imaged can be embodied identically in each case. They can also be embodied differently. It is possible, in particular, to choose the shape of the structure elements to be imaged from a predefined choice of different shapes.

The design of the test object is simplified as a result.

In accordance with one aspect of the invention, at least one subset of the structure elements to be imaged is embodied in bar- or slit-shaped fashion. It is possible, in particular, for all of the structure elements to be embodied in this way. The structure elements can also be embodied in a cruciform fashion or in a star-shaped fashion or be combined to form such shapes. Punctiform, i.e. pinhole-like structure elements are also possible.

A structure in which the structure elements run radially outward in each case relative to a center has proved to be particularly advantageous.

In accordance with a further aspect of the invention, the structure elements each have dimensions which, as considered locally, are smaller than the Airy diameter ($d_{Airy}$) of the optical system in each case in at least one direction. The structure elements to be imaged each have in their entire region, in particular, dimensions which are smaller than the Airy diameter ($d_{Airy}$) of the optical system in each case in at least one direction. In other words, as considered locally, they are small enough to ensure an illumination of the pupil for which all spatial frequencies up to a predefined minimum frequency contribute a minimum contribution to the illumination of the pupil, in particular also in the edge region thereof.

The structures to be imaged can be smaller than $d_{Airy}/2$, in particular smaller than $d_{Airy}/3$, in particular smaller than $d_{Airy}/5$, in particular smaller than $d_{Airy}/10$, in particular in each case in at least one direction. Depending on the radiation source provided, the Airy diameter ($d_{Airy}$) can be less than 1 μm, in particular less than 650 nm, in particular less than 300 nm, in particular less than 100 nm, in particular less than 50 nm, in particular less than 30 nm, in particular less than 15 nm. The latter may be the case in particular in a projection optical unit for EUV lithography.

The structure elements to be imaged have, in particular, dimensions which, as considered locally, are larger than the Airy diameter ($d_{Airy}$) of the optical system in each case in at least one second direction. As a result, they differ from pinholes that are usually used for such test objects. Therefore, they are also designated as extensive structure elements, in particular.

The respective largest dimension of the structure elements, as considered locally, can be in particular at least double the magnitude, in particular at least three times the magnitude, in particular at least five times the magnitude, in particular at least ten times the magnitude, of the Airy diameter ($d_{Airy}$). It is, in particular, in each case at most equal to the magnitude of the diameter of the isoplanatic patch, in particular of a region in which it changes the point spread function (PSF) by at most 5%, in particular at most 2%.

The structures can be embodied, in particular, depending on the optical system to be examined. The respective smaller dimension of the structure elements can be chosen, in particular, depending on the Airy diameter ($d_{Airy}$) of the optical system. The respective larger dimension can be chosen, in particular, depending on the dimensions of the isoplanatic patch of the optical system.

In accordance with a further aspect of the invention, the structure has overall a surface area ($A_{Struct}$) which is at least 0.2 times the magnitude of the square of the Airy diameter ($d_{Airy}^2$) of the optical system, $A_{Struct} \geq 0.2\ (d_{Airy})^2$.

The surface area ($A_{Struct}$) of the structure is in particular at least 0.5 times, in particular at least equal to, in particular at least twice, in particular at least three times, in particular at least five times, in particular at least ten times, in particular at least twenty times, in particular at least thirty times, in particular at least fifty times, in particular at least one hundred times, in particular at least two hundred times, in particular at least three hundred times, in particular at least five hundred times, in particular at least one thousand times, the magnitude of the square of the Airy diameter ($d_{Airy}^2$) of the optical system. It goes without saying that the surface area ($A_{Struct}$) cannot be arbitrarily large. The values indicated can in particular also serve as an upper limit for the surface area ($A_{Struct}$).

The total transfer of the imaging radiation can be increased by such an embodiment of the structure.

The total transfer achieved with the structure to be imaged according to the invention is in particular at least three times, in particular at least five times, in particular at least ten times, in particular at least twenty times, in particular at least fifty times, in particular at least one hundred times, in particular at least two hundred times, in particular at least five hundred times, in particular at least one thousand times, the magnitude of the radiation transfer of a circular structure having the Airy diameter.

Such a structure increases the luminous efficiency, in particular. Moreover, the signal-to-noise ratio is improved thereby. Furthermore, the accuracy of the system evaluation is increased. Moreover, the measuring method can be accelerated. Such a structure enables, in particular, shorter integration times when recording the images.

The structure, in particular the structure elements, can be embodied in a reflective or transmissive fashion. In the case of a reflective structure, the total transfer is characterized by the reflectance of the structure. In the case of a transmissive structure, the total transfer is characterized by the transmittance of the structure. The total transfer is in particular at least 0.1%, in particular at least 1%, in particular at least 5%, in particular at least 10%, in particular at least 20%, in particular at least 50%. It can also be more than 70%, in particular more than 90%.

In accordance with one aspect of the invention, the structure is embodied as a phase shift mask, as an amplitude mask or as a mixed amplitude and phase shift mask. It can be embodied in particular as an absorption mask or as a transmission mask. A structured diaphragm, in particular a binary amplitude mask, can be involved, in particular. In this case, the non-transmissive regions can have a residual transmission of at most 2%, in particular at most 1%. A progressive mask can also be involved. In the case of a phase shift mask, too, a phase shift mask having a continuous progression or a phase shift mask having discrete phase steps, in particular having at least two, in particular at least four, phase steps, can be involved. In the case of a discrete phase shift mask, the phase steps have, in particular, a minimum structure width. The minimum structure width is in particular at least $d_{Airy}/4$, in particular at least $d_{Airy}/2$, in particular at least 1 $d_{Airy}$, in particular at least 2 $d_{Airy}$, where $d_{Airy}$ indicates the Airy diameter of the optical unit, $d_{Airy}=1.22\lambda/NA$, where $\lambda$=wavelength of the illumination radiation and NA=numerical aperture of the optical unit. The wavelength $\lambda$ of the illumination radiation is in particular less than 300 nm, in particular less than 250 nm, in particular less than 150 nm, in particular less than 100 nm, in particular less than 50 nm, in particular less than 30 nm. The numerical aperture NA is usually in the range of 0.1 to 1.6. It can be in particular at least 0.2, in particular at least 0.3, in particular at least 0.4. It can be in particular less than 1.4, in particular less than 1.2, in particular less than 1.0, in particular less than 0.8.

The mask can be embodied in particular as a chromium-on-glass mask, as an opaque molybdenum-silicon-on-glass mask or as a molybdenum-silicon mask.

In accordance with a further aspect of the invention, the test object comprises a plurality of structures. The structures can be arranged in a matrix of rows and columns. A matrix having at least two, in particular at least three, in particular at least four, rows and/or columns can be involved, in particular.

A non-Cartesian arrangement can also be provided for the individual structures. The individual structures of the matrix can be embodied identically in each case. They can also be embodied differently. They can be chosen in particular from a predefined number of different structures.

The individual structures of the matrix have a minimum spacing, in particular.

The minimum spacing between two adjacent structures is in particular at least twice, in particular at least three times, in particular at least five times, in particular at least ten times, the magnitude of the maximum of the diameters of the circumcircles of the respective structures. This makes it possible to ensure that the images of the corresponding structures do not overlap even in a maximum defocus position.

A further problem addressed by the invention is to specify a use of the test object in accordance with the above description.

The test object can be used in particular for determining the point spread function of an optical system. The optical system can be in particular a projection exposure apparatus, in particular a DUV or an EUV projection exposure apparatus, or a mask inspection apparatus. The advantages emerge from those of the test object.

Further problems addressed by the invention are to improve a device for measuring the point spread function of an optical system, and an optical system comprising such a device.

These problems are solved via a device comprising a test object in accordance with the above description, and an optical system comprising such a device.

In accordance with one aspect of the invention, the device comprises at least one mechanism for varying the illumination distribution in the pupil, in particular at least one mechanism for object diversification and/or for pupil diversification. The test object is a component part thereof.

In accordance with one aspect of the invention, the at least one mechanism for varying the illumination distribution in the pupil comprises a displacing and/or changing unit, via which a mask is held. The mask can be positioned in particular via the unit in the beam path of the optical system. It is displaceable, in particular linearly shiftable, in particular in a direction perpendicular to the optical axis, via the displacing unit, in particular. It can also be rotatable, in particular about the optical axis. The mask is advantageously exchangeable.

In accordance with one aspect of the invention, the test object is arranged in the region of an object plane or at least in proximity to an object plane via the displacing and/or changing unit. For a pupil diversification, the test object is arranged in particular in a pupil plane or in proximity to a pupil plane via the displacing and/or changing unit.

In accordance with one aspect of the invention, the optical system comprises at least two measuring devices. The measuring devices can be arranged in particular at different distances from the structure to be imaged. They can enable simultaneous recording of the images of the structure to be imaged. The optical system can comprise a beam splitter, in particular.

The measuring devices can be arranged in particular at a distance of up to six Rayleigh lengths with respect to one another. The distance between the measuring devices can be for example 1, 2, 3, 4, 5 or 6 Rayleigh lengths. Other distances are likewise possible. Preferably, at least one measuring device is arranged intrafocally and at least one measuring device is arranged extrafocally.

Generally, the structure to be imaged and the at least one measuring device are displaceable relative to one another in the direction of the optical axis. A predefined defocus and a corresponding defocus image stack can be achieved as a result. The defocus can be achieved via an image-side defocusing of the measuring device and/or via an object-side defocusing of the structure to be imaged.

A further problem addressed by the invention is to improve a method for measuring the point spread function of an optical system, in particular of a projection exposure optical unit for semiconductor fabrication or a mask inspection optical unit for semiconductor fabrication.

This problem is solved via a method comprising the following steps: providing an optical system in accordance with the above description, providing an illumination device for illuminating the test object with illumination radiation, and recording a focus stack having at least two images in different defocus positions of the structure to be imaged via the at least one measuring device. The point spread function and/or the complex illumination distribution in a pupil of the optical system can subsequently be ascertained from the images of the focus stack.

The method is significantly improved by the properties according to the invention of the structure to be imaged and/or by the diversification mechanism according to the invention. It is possible, in particular, to determine the imaging quality of the optical system without additional image-side components. Moreover, the method is accelerated and the accuracy is improved.

The method is suitable in particular, for being integrated into existing optical systems, that is to say for being used for measuring existing optical systems. It makes it possible, in particular, to determine the system aberrations, in particular broken down according to the respective types: coma, astigmatism, spherical aberration, higher-order coma, etc.

An illumination device which generates coherent radiation can be provided for illuminating the structure to be imaged. It is also possible to use an illumination device having only parallel coherent or incoherent radiation. The illumination device can comprise a radiation source in the form of a laser. The laser can generate in particular used radiation having a wavelength in the visible range, in the UV range or in the VUV range. An EUV radiation source, an IR radiation source, an LED radiation source or an incandescent lamp, in particular with a color filter, can also serve as radiation source.

The method is suitable in particular for different optical systems, in particular for projection optical units, in particular for projection exposure apparatuses, for microlithography, and mask inspection optical units. The method is usable in particular also for determining the imaging quality of projection optical units for VUV and/or EUV projection lithography.

In accordance with one aspect of the invention, the illumination distribution in the pupil is developed according to orthogonal polynomials. It can be developed in particular according to Zernike polynomials. The Zernike coefficients can serve as characteristic figures for the imaging quality.

In accordance with one aspect of the invention, an error reduction algorithm, in particular an iterative error reduction algorithm, an optimization algorithm, in particular a modal optimization algorithm, or a direct inversion method, in particular an algorithmic or a database-aided inversion method, is used for determining the illumination distribution.

A suitable one of these different methods and algorithms can be chosen from among them as necessary.

In accordance with a further aspect of the invention, an object diversification or a pupil diversification is carried out for generating the image stack.

This is possible in a particularly simple manner. The advantages arise from those described for the optical system.

In accordance with a further aspect of the invention, the images are recorded in defocus positions of at least one Rayleigh length with an integration time of at most 20 ms, in particular at most 10 ms, in particular at most 5 ms, in particular at most 2 ms, in particular at most 1 ms.

On account of such a short integration time, it is possible to record at least one portion of the images of the focus stack multiply, in particular at least twice, in particular at least three times, within a predefined time. It is possible, in particular, to record the entire focus stack at least twice, in particular at least three times, within a predefined time. The obtainable accuracy can be improved as a result.

In accordance with a further aspect of the invention, the images of the focus stack are recorded with an integration time which varies by at most a factor of 10 for two different defocus positions. It has been found that this is possible on account of the improved radiation transfer, that is to say on account of the improved camera illumination and thus an improved signal-to-noise ratio. The ratio of the integration times of two different images of the focus stack is in particular at most 5, in particular at most 3, in particular at most 2, in particular at most 1.5, in particular at most 1.3, in particular at most 1.2, in particular at most 1.1. It is possible, in particular, to record images in large defocus positions, in particular in defocus positions of at least one Rayleigh length, in particular at least two Rayleigh lengths, in particular at least three Rayleigh lengths, with an integration time which is greater than the integration time when recording the image in the best focus by a factor of at most 10, in particular of at most 5, in particular of at most 3, in particular of at most 2, in particular of at most 1.5, in particular of at most 1.3, in particular of at most 1.2, in particular of at most 1.1.

In accordance with a further aspect of the invention, the point spread function of the optical system is ascertained position by position. It can be ascertained in particular for a single field position, for example for the field position of the optical axis, or for a selection of different field positions. It is possible, in particular, to ascertain the point spread function in a parallelized fashion for a plurality of field positions. In particular a test object having an order of a plurality of structures to be imaged in accordance with the above description is advantageous for this purpose.

In accordance with a further aspect of the invention, provision is made for ascertaining an averaged point spread function. Provision is made, in particular, for ascertaining a point spread function that is averaged over the size of the extensive structure.

Figure 2:
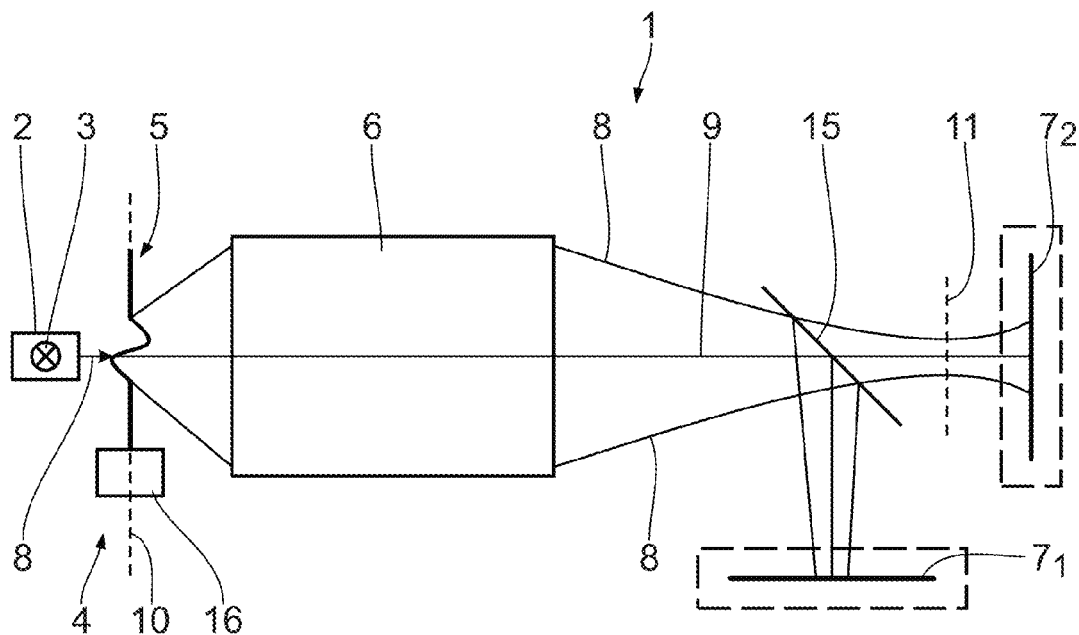
Figure 3:
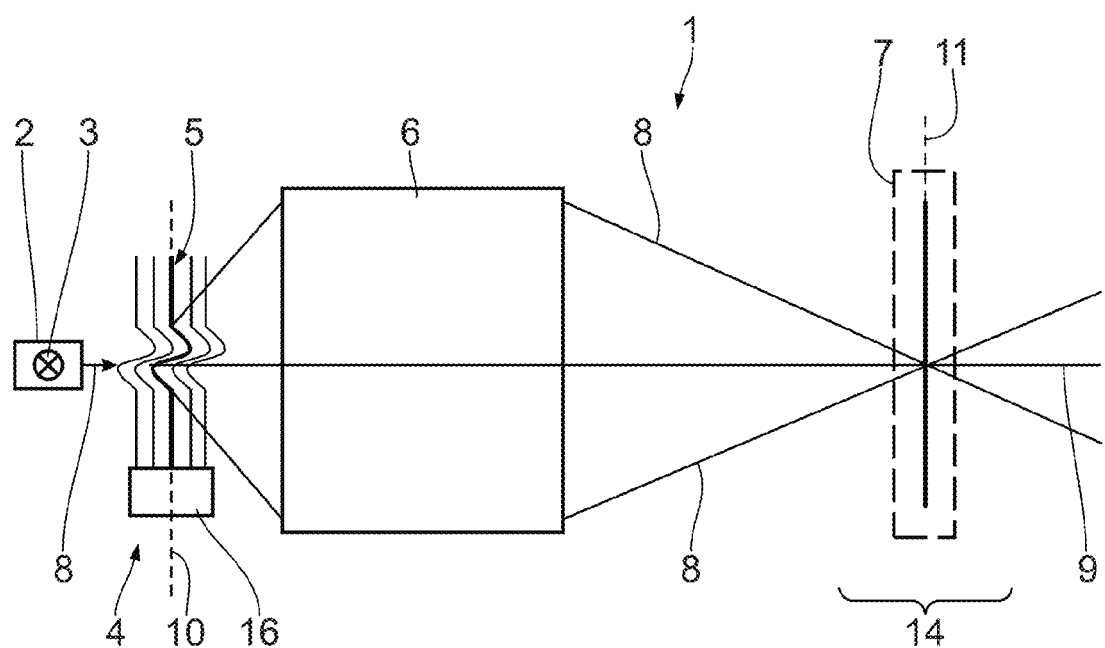
Figure 5:
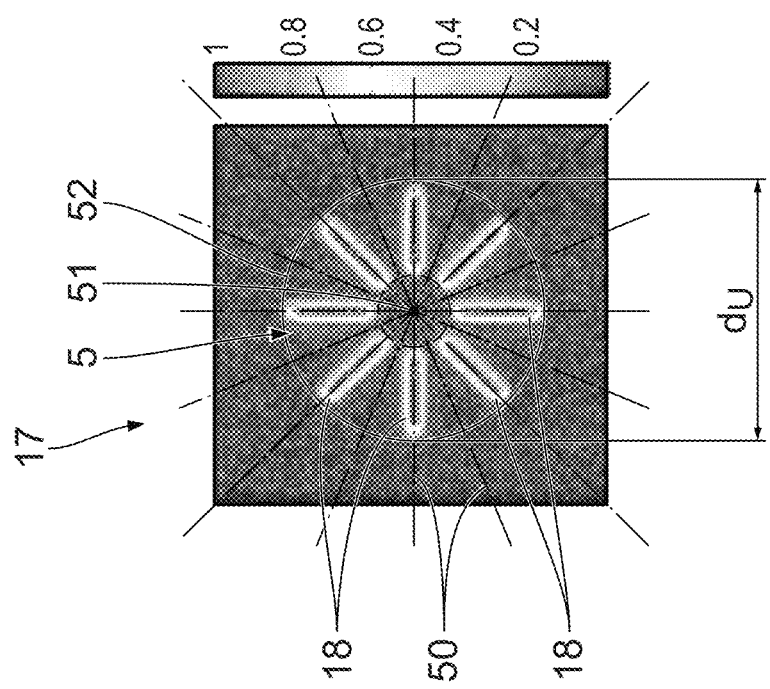
Figure 4:
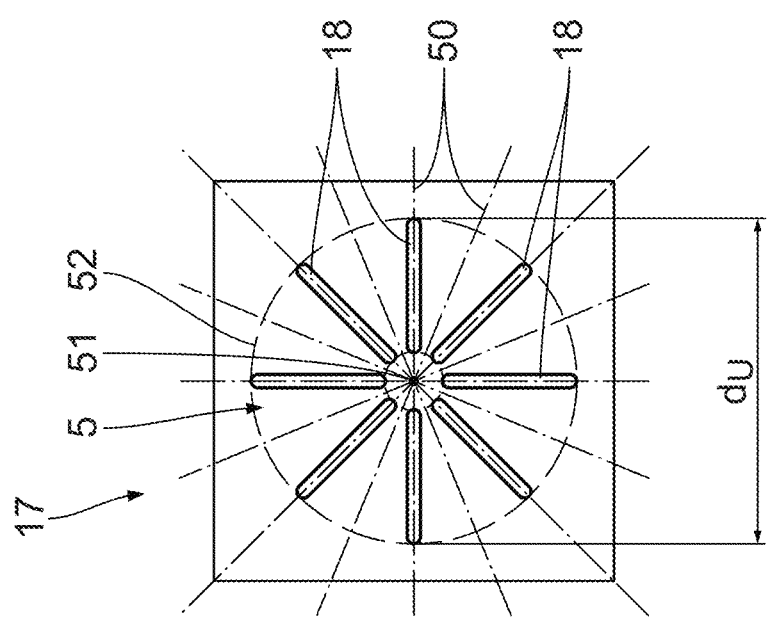
Figure 7:
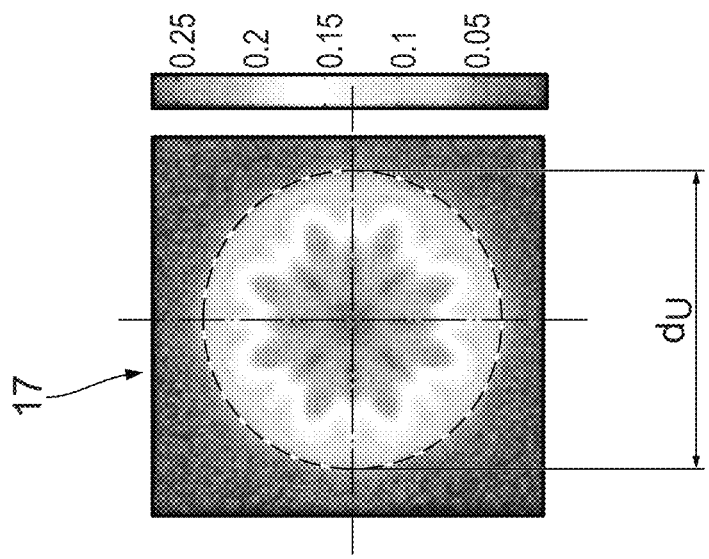
Figure 6:
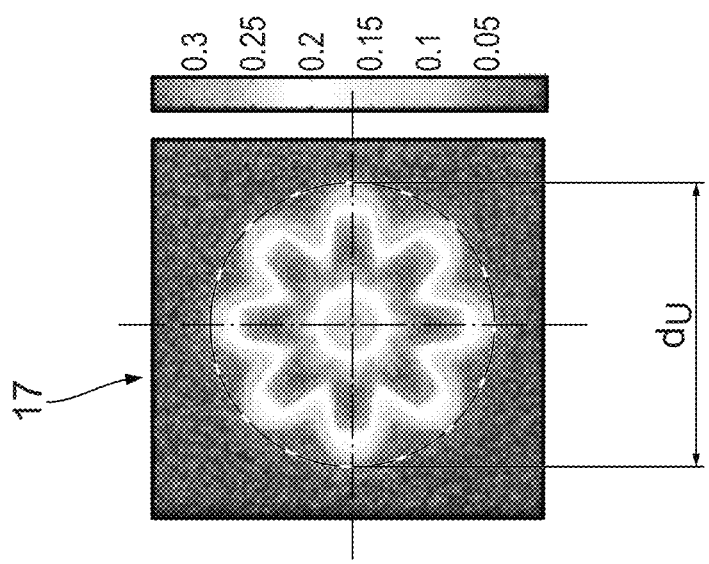
Figure 8:
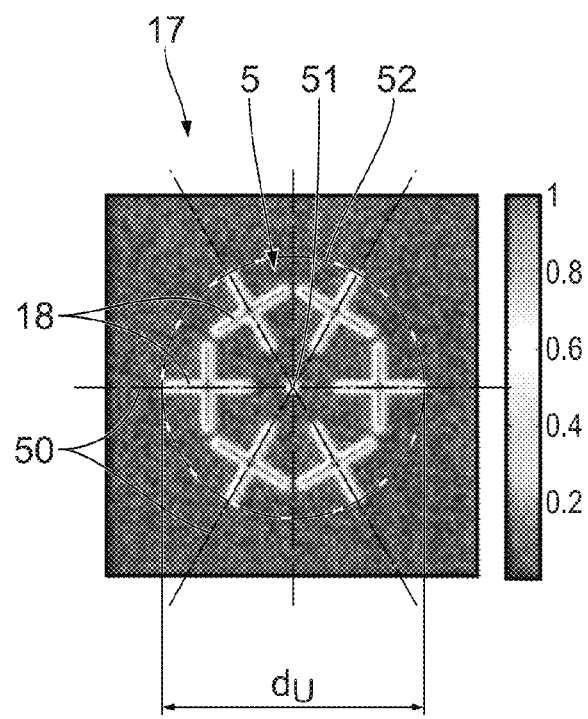
Figures 9, 10:
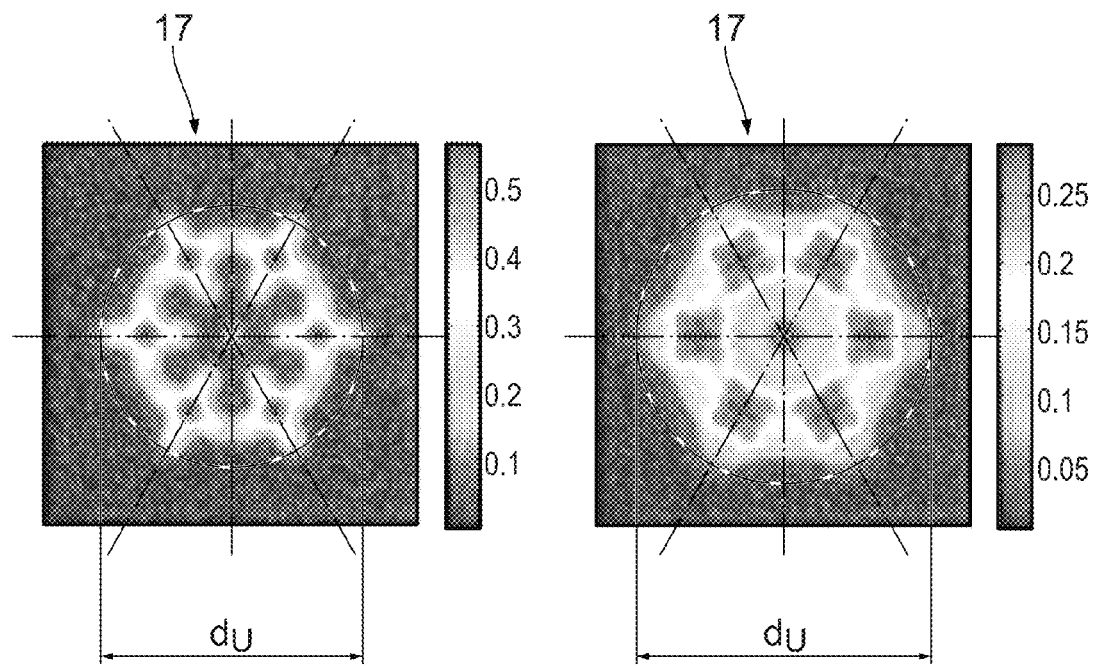
Figure 11:
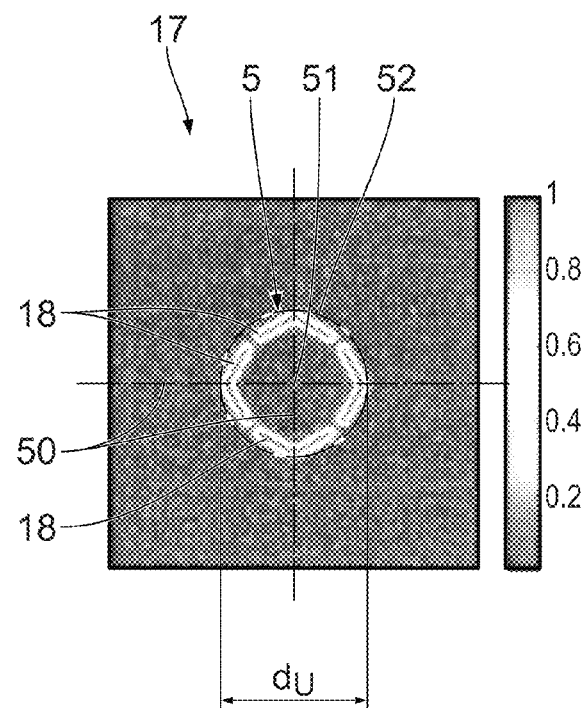
Figure 12:
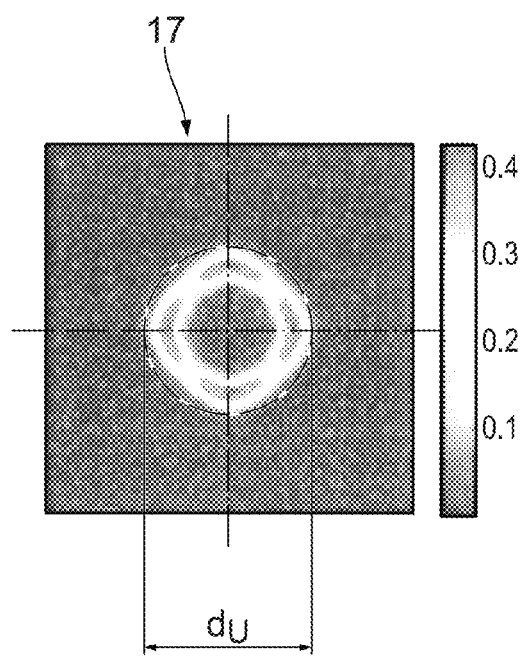
Figure 13:
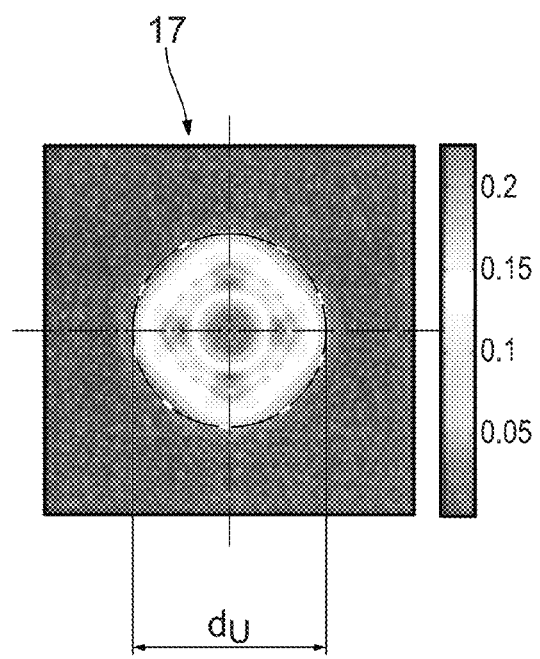
Figure 17:
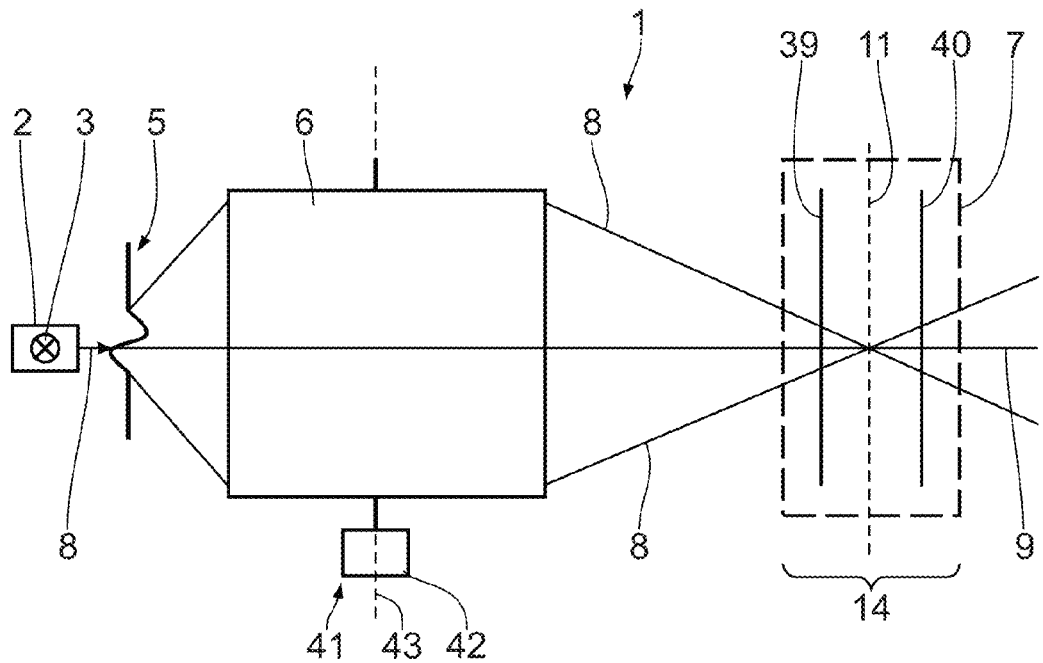
Figure 18:
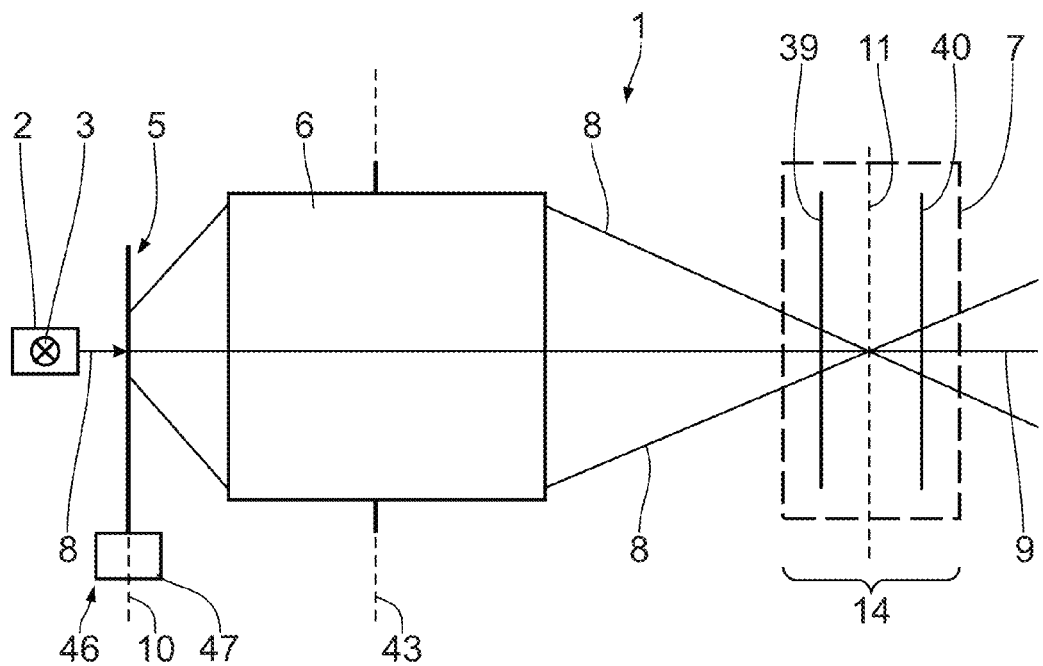
Figure 19:
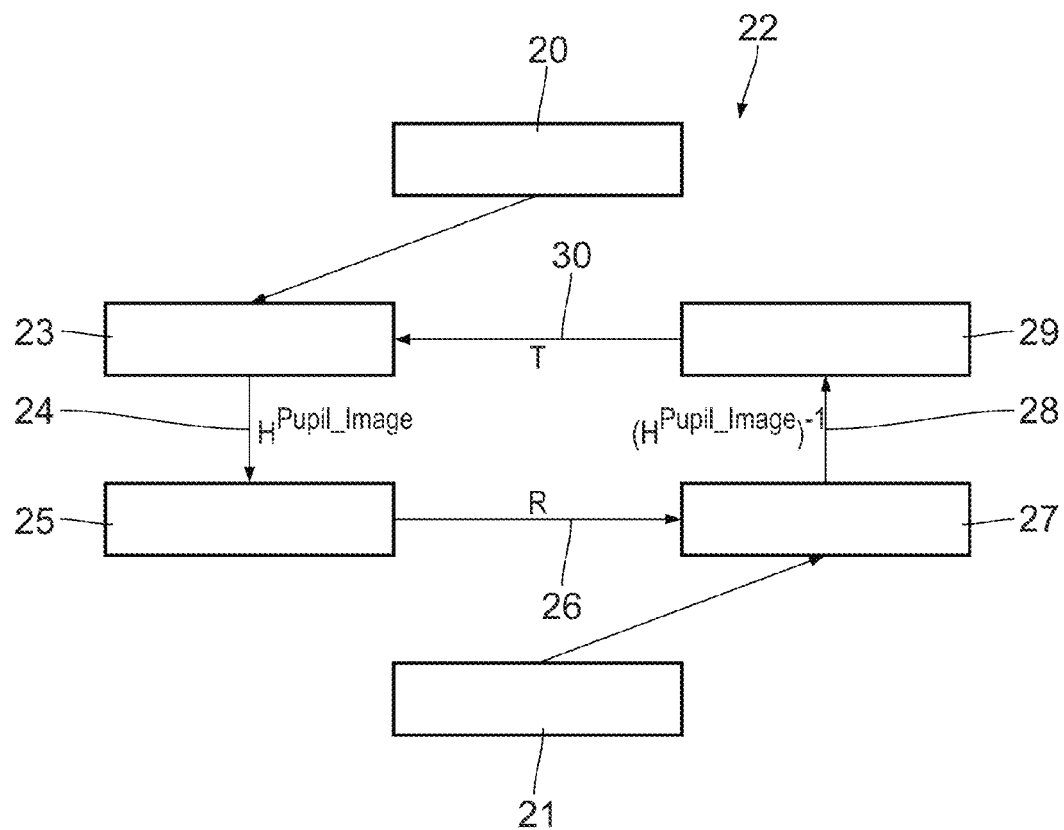
Figure 20:
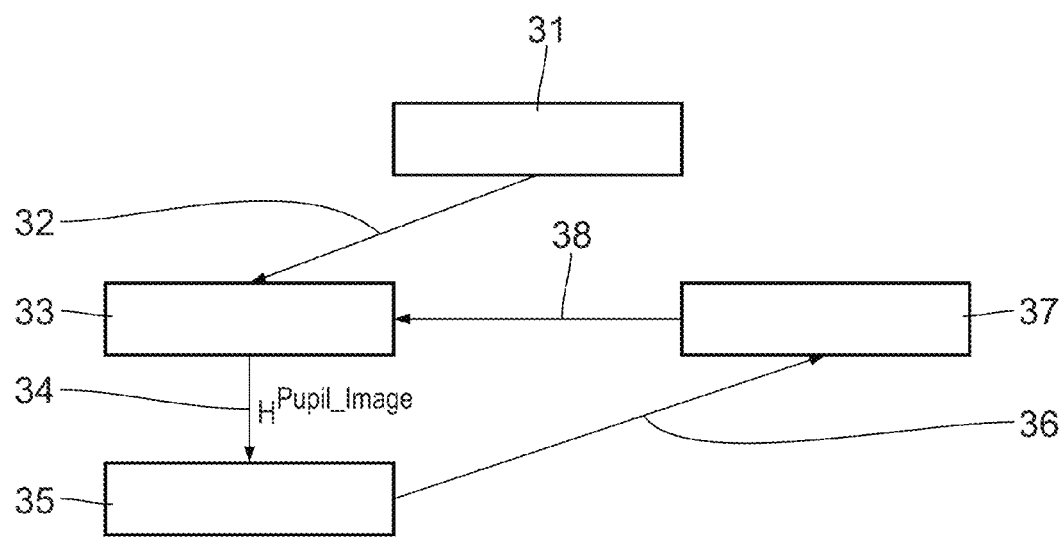
Figure 21F:
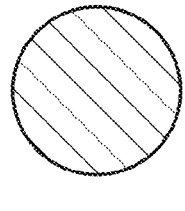
Figure 21E:
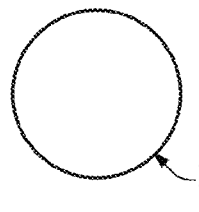
Figure 21D:
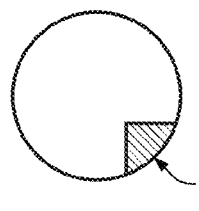
Figure 21C:
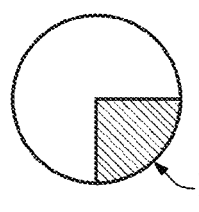
Figure 21B:
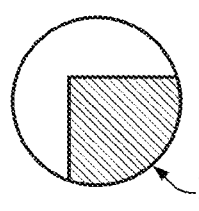
Figure 21A:
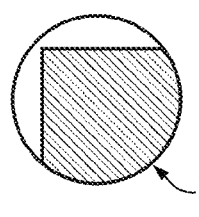
Figure 22F:
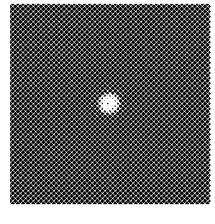
Figure 22E:
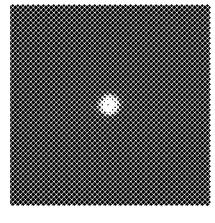
Figure 22D:
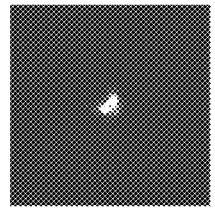
Figure 22C:
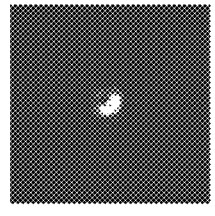
Figure 22B:
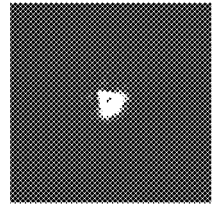
Figure 22A:
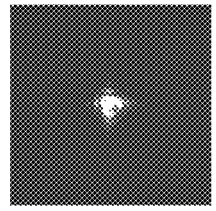
Figure 23F:
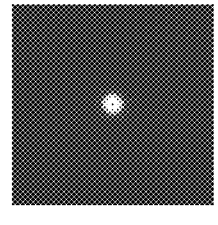
Figure 23E:
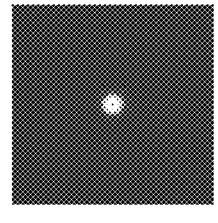
Figure 23D:
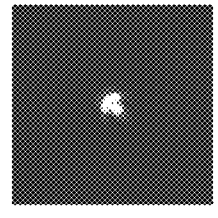
Figure 23C:
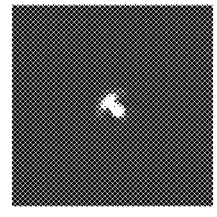
Figure 23B:
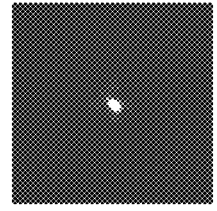
Figure 23A:
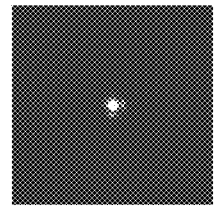

Further advantages and details of the invention will become apparent from the description of a plurality of exemplary embodiments with reference to the drawings, in which:

FIG. 1 shows a greatly simplified, schematic illustration of an optical system,

FIG. 2 shows a schematic illustration of one variant of the optical system in accordance with FIG. 1, FIG. 3 shows a greatly simplified, schematic illustration of a further optical system, FIG. 4 shows a plan view of a structure to be imaged, FIG. 5 shows a schematic illustration of the amplitude distribution of the image of the mask in accordance with FIG. 4 in a focal plane, FIG. 6 shows a schematic illustration of the amplitude distribution of the image of the mask in accordance with FIG. 4 in a first defocus position at −1.5 Rayleigh lengths, FIG. 7 shows a schematic illustration of the amplitude distribution of the image of the mask in accordance with FIG. 4 in a first defocus position at −3 Rayleigh lengths, FIGS. 8 to 10 show schematic illustrations in accordance with FIGS. 5 to 7 of images of a further structure to be imaged, FIGS. 11 to 13 show schematic illustrations in accordance with FIGS. 5 to 7 of images of a further structure to be imaged, FIGS. 14 to 16 show schematic illustrations of further structures to be imaged, FIG. 17 shows a greatly simplified, schematic illustration of a further optical system, FIG. 18 shows a greatly simplified, schematic illustration of a further optical system, FIG. 19 shows a schematic illustration of an iterative algorithm for ascertaining a pupil function, FIG. 20 shows a schematic illustration of a modal algorithm for determining a pupil function, FIGS. 21a to 21f show exemplary illustrations of a phase shift mask in different insertion positions in a pupil plane, FIGS. 22a to f show exemplary illustrations of the images of a point source recorded in an intrafocal position, wherein the images correspond to the different positions of the phase shift mask in FIGS. 22a to f, FIGS. 23a to f show corresponding images recorded from an extrafocal camera position, FIGS. 24a to f show illustrations of a pupil manipulation mask in the form of an amplitude gap in different rotational positions, and FIGS. 25a to f show illustrations of a pupil manipulation mask in the form of a phase gap in different rotational positions.

An optical system 1 illustrated by way of example in FIG. 1 comprises an illumination device 2 having a radiation source 3, a device 4 having a structure 5 to be imaged, an imaging optical system in the form of a projection optical unit 6, and a measuring device 7 for recording at least one image of the structure 5 to be imaged.

FIG. 1 additionally schematically illustrates the beam path of the illumination radiation 8 emitted by the radiation source 3, and also an optical axis 9 of the optical system 1, in particular of the projection optical unit 6.

The imaging optical system is, in particular, a projection optical unit 6 of a projection exposure apparatus, in particular for microlithography. The projection optical unit 6 can be embodied in a catoptric, dioptric or catadioptric fashion.

The illumination radiation 8 can be in the visible wavelength range. It can also be in the IR, UV, VUV, DUV or EUV range. It is monochromatic, in particular. However, it can also be polychromatic. As will be explained in even greater detail later, coherent illumination radiation 8 can be involved. However, it is also possible to use a radiation source 3 which generates only partially coherent or incoherent illumination radiation 8.

In accordance with FIG. 1, the structure 5 to be imaged is arranged in an object plane 10. It is arranged at least in proximity to an object plane 10.

The at least one measuring device 7 is displaceable in the direction of the optical axis 9. It can be arranged in the region of an image plane 11. It can also be arranged in an intrafocal region 12 or an extrafocal region 13. In other words, it is defocusable. FIG. 1 illustrates schematically and by way of example in each case three intrafocal and three extrafocal arrangements of the measuring device 7, wherein adjacent arrangements in each case have a mutual spacing of one Rayleigh length $L_R$. In other words, the measuring device 7 has a defocus region 14 of ±3 Rayleigh lengths.

As an alternative to a single measuring device 7, the optical system 1, as is illustrated by way of example in FIG. 2, can have a beam splitter 15 and two measuring devices $7_1$, $7_2$. In this case, the first measuring device $7_1$ can be arranged intrafocally in the beam path. The second measuring device $7_2$ can be arranged extrafocally in the beam path. The measuring devices $7_1$, $7_2$ can be arranged displaceably in the beam path in each case in the direction of the optical axis 9. They can also be arranged in a stationary fashion in the beam path. An embodiment comprising a plurality of measuring devices $7_i$ makes it possible to simultaneously record a plurality of images of the structure 5 to be imaged, in particular in different defocus positions. In particular, the speed of the method according to the invention can be increased as a result.

As an alternative or in addition to a defocusability of the at least one measuring device 7, as is illustrated schematically in FIG. 3, the structure 5 to be imaged can also be displaceable in the direction of the optical axis 9. For this purpose, the device 4 comprises a displacing and/or changing unit 16. With the aid of the displacing and/or changing unit 16, the structure 5 to be imaged can be arranged in the beam path of the optical system 1. With the aid of the displacing and/or changing unit 16, the structure 5 to be imaged is in particular displaceable and/or exchangeable.

A beam splitter 15 can be provided in the case of the exemplary embodiment in accordance with FIG. 3, too.

It is also possible for both the structure 5 to be imaged and the at least one measuring device 7 to be embodied as displaceable in the direction of the optical axis 9.

Generally, in particular the distance between the structure 5 to be imaged and the at least one measuring device 7 is variable in the direction of the optical axis 9.

The illumination device 2 can comprise further components in addition to the radiation source 3. This can involve, in particular, optical elements, for example a collector, a focusing element or diaphragms. Control elements for controlling, in particular activating, the radiation source 3 can also be involved.

The device 4 is described in greater detail below. The device 4 is, in particular, a device for determining the point spread function (PSF) and/or the imaging quality of the optical system 1, in particular of the projection optical unit 6. The device 4 comprises, in particular, a test object 17 having the structure 5 to be imaged. The structure 5 to be imaged is described in even greater detail below. The structure 5 to be imaged of the device 4 is adapted to the optical system 1 to be measured, in particular the projection optical unit 6. The structure 5 to be imaged is adapted in particular to the wavelength of the illumination radiation 8 emitted by the radiation source 3, and to the numerical aperture of the projection optical unit 6. A parameter of the optical system 1, in particular of a projection optical unit 6, which is particularly relevant to the illumination of the pupil thereof is the Airy diameter $d_{Airy}$. In order to detect the entire wavefront of the system, it is desirable to completely illuminate the pupil. The Airy diameter $d_{Airy}$ is dependent on the wavelength of the illumination radiation emitted by the radiation source 3, the refractive index of the surrounding medium and the numerical aperture, in particular the object-side numerical aperture. In the case of a traditional phase retrieval, a pinhole is usually used as structure to be imaged. For a complete illumination of the pupil, the pinhole has a diameter of less than 0.4 $d_{Airy}$. This has the effect that the light power or the total transfer of the imaging radiation through the pinhole is very low.

It has been recognized according to the invention that the structure 5 to be imaged can be significantly improved by being designed in such a way that it leads, on the one hand, with the illumination radiation 8 used, to a complete illumination of the pupil of the optical system 1, in particular of the projection optical unit 6, and on the other hand it leads to a total transfer of the imaging radiation which is at least double the magnitude of the radiation transfer of a pinhole having the Airy diameter $d_{Airy}$. The structure 5 to be imaged is preferably embodied in such a way that the total transfer is at least three times, in particular at least five times, in particular at least ten times, in particular at least twenty times, in particular at least fifty times, in particular at least one hundred times, in particular at least two hundred times, in particular at least five hundred times, in particular at least one thousand times, the magnitude of the radiation transfer of a circular structure having the Airy diameter $d_{Airy}$.

The structure 5 to be imaged, as illustrated in FIG. 4, is an amplitude structure, also designated as an amplitude mask. In particular, a structured diaphragm, that is to say a zero-one transmission mask, is involved. In particular, a binary mask is involved. In this case, the minimum transmission need not necessarily be equal to zero. There may also be a residual transmission, for example in the case of a chromium mask. The minimum transmission can be for example up to 5%, up to 2% or up to 1% of the maximum transmission.

The test object 17 is described in greater detail below. The test object 17 is a mask, in particular. The test object 17 comprises the structure 5 to be imaged. The structure 5 to be imaged, for its part, comprises a plurality of structure elements 18 to be imaged. It can also consist of the structure elements 18.

The structure 5 to be imaged has, in particular, a multiplicity of structure elements 18. The latter are not necessarily embodied in a disconnected fashion. However, they can be embodied in a disconnected fashion. They can be embodied in particular in each case separately in pairs, that is to say in a disconnected fashion. They can also be arranged in an overlapping fashion.

The structure elements 18 are embodied in bar- or slit-shaped fashion. This leads in particular to an improved sensitivity in respect of aberrations, in particular with regard to directions perpendicular to the respective longitudinal directions of the structure elements 18.

The structure elements 18 each have dimensions which, as considered locally, are smaller than the Airy diameter $d_{Airy}$, in particular less than 0.5 $d_{Airy}$, in particular less than 0.4 $d_{Airy}$, of the optical system 1, in particular of the projection optical unit 6, in at least one direction.

In a direction perpendicular thereto, the structure elements 18 each have larger dimensions. They each have, as considered locally, dimensions which are larger than the Airy diameter $d_{Airy}$, in particular greater than 2 $d_{Airy}$, in particular greater than 3 $d_{Airy}$, in particular greater than 5 $d_{Airy}$, in particular greater than 10 $d_{Airy}$, of the optical system 1 in at least one direction.

The structure elements 18 each have in particular dimensions which are less than 0.5 μm, in particular less than 0.3 μm, in particular less than 0.1 μm, in a first direction. In a direction perpendicular thereto, they each have dimensions which are in the range of 2 μm to 5 μm.

The respective largest extent of the structure elements 18 as considered locally is preferably at most of the same magnitude as the diameter of the isoplanatic patch, in particular of a region in which the point spread function of the optical system 1 changes by at most 5%, in particular at most 2%.

The structure elements 18 are embodied and arranged in such a way that the structure 5 to be imaged has eight axes 50 of symmetry.

The structure elements 18 are generally arranged in particular in such a way that the structure 5 to be imaged has at least two, in particular at least three, in particular at least four, in particular at least five, in particular at least six, in particular at least eight, axes 50 of symmetry. Preferably, at least two of the axes 50 of symmetry are perpendicular to one another. The structure 5 to be imaged thus preferably has a point symmetry. It preferably has a rotational symmetry having an even order. It has in particular a rotational symmetry having an order of at least two, in particular at least four, in particular at least six, in particular at least eight.

The structure elements 18 are embodied and arranged in particular in such a way that the structure 5 to be imaged induces no asymmetrical image aberrations.

The structure elements 18 are embodied and arranged in particular in such a way that the structure 5 to be imaged, in particular in the case of a symmetrical illumination, generates no coma aberration.

The symmetry properties of the structure 5 to be imaged have the effect that at least the orthogonality of the Zernike polynomials of identical type or order, for example C7 and C8, C5 and C6 or C10 and C11, is maintained. The structure 5 to be imaged can be arranged in particular in such a way that it has mirror symmetries with respect to predefined x- and y-axes. The lowest-order Zernike orthogonality can be ensured as a result.

On account of the design of the structure elements 18, the structures 5 to be imaged amplify the effect of asymmetrical aberrations, as a result of which the latter can be retrieved more distinctly in a phase retrieval.

Moreover, the phase aberrations induced in the case of extensive structures 5 having the symmetry properties described above are smaller phase aberrations (rigorous effects) than in the case of asymmetrical structures.

In the case of the structure 5 illustrated in FIG. 4, all of the structure elements 18 run in each case in a radial direction proceeding from a center 51. This has proved to be particularly advantageous.

The test object 17 is a mask, in particular. An absorption or a transmission mask can be involved here in particular. A phase shift mask, in particular a so-called attenuated phase shift mask (APSM), can also be involved.

The mask can comprise in particular constituents composed of chromium, molybdenum, silicon or compounds comprising these elements. It can in particular also comprise portions composed of glass.

The mask can comprise in particular an absorbent layer having a thickness in the range of 10 nm to 1 µm, in particular in the range of less than 500 nm, in particular less than 300 nm, in particular less than 200 nm, in particular less than 100 nm.

FIGS. 5 to 7 illustrate by way of example images of the structure 5 to be imaged of the test object 17 in accordance with FIG. 4. FIG. 5 in this case illustrates an image of the structure 5 to be imaged in the best focus position. FIG. 6 shows an image of the structure 5 to be imaged in a defocused position of −1.5 Rayleigh lengths. FIG. 7 shows an image of the structure 5 to be imaged in a defocused position of −3 Rayleigh lengths.

A significantly greater total transfer, in particular a significantly greater intensity of the images, occurs on account of the extent of the structure 5 to be imaged. This is manifested in a positive way in particular as the defocus increases. This has the effect that especially in the range of the larger defocus positions, the exposure time duration, in particular the integration time for recording an image of the focus stack, can be reduced by up to one order of magnitude. This makes it possible, in particular, to record a focus stack with the structures 5 to be imaged according to the invention, wherein the integration time is substantially constant over the entire focus stack. The integration time can be less than 20 ms, in particular less than 10 ms, in particular less than 5 ms, in particular less than 2 ms and in particular less than 1 ms, in particular over the entire focus stack.

Moreover, the extent of the structure 5 to be imaged leads to a considerable reduction of the total measurement duration. This can be used as necessary for repeating the measurements at least once, in particular at least twice, in particular at least three times or more often. The accuracy of the measurements can be increased further as a result.

FIGS. 8 to 10 illustrate images in the focus (FIG. 8), in a defocus position of −1.5 Rayleigh lengths (FIG. 9) and in a defocus position of −3 Rayleigh lengths (FIG. 10) of an alternative structure 5 to be imaged.

The embodiment and arrangement of the structure elements 18 of this structure 5 to be imaged can be gathered from the image in the focus (FIG. 8). In the case of this structure 5, two bar- or slit-shaped structure elements 18 are respectively arranged in an overlapping fashion. They form respective cruciform elements. Moreover, a pinhole is arranged in the center 51. The structure 5 has, in particular, a central pinhole surrounded by six cruciform structure elements 18. The cruciform structure elements 18 are arranged in particular uniformly around the pinhole. The cruciform structure elements 18 are arranged in particular in such a way that their center, that is to say the crossover point of the two bar- or slit-shaped structure elements 18, lies on a circle having a diameter of approximately 6 µm.

The bar- or slit-shaped structure elements 18 have an orientation relative to a predefined axis, in particular an axis running horizontally in the figure, of n·30°, where n is an arbitrary natural number. In this case, the structure 5 to be imaged has six axes of symmetry. It has a six-fold rotational symmetry.

FIGS. 11 to 13 illustrate by way of example three further images in the focus (FIG. 11), at −1.4 Rayleigh lengths (FIG. 12), and at −3 Rayleigh lengths (FIG. 13) of a further structure 5. In the case of this structure 5, the structure elements 18 respectively form angles, in particular, obtuse angles. The structure 5 comprises in particular four angles arranged around a pinhole arranged in the center 51. The angles are arranged in particular on a circle having a diameter of approximately 3 µm. This structure 5 has four axes of symmetry. Overall, the structure 5 has a ring-shaped design. However, it has a discrete, two-fold rotational symmetry.

FIG. 14 illustrates a further alternative of the structure 5 to be imaged. In the case of this alternative, the structure 5 comprises four star-shaped structure elements 18 arranged around a pinhole in the center 51. The star-shaped elements are formed in each case by three bar- or slit-shaped structure elements 18 arranged at an angle of 120° with respect to one another. The arrangement of the inner two structure elements 18 corresponds to the arrangement of that structure which formed the basis for the image in accordance with FIG. 11.

FIG. 15 illustrates a further alternative of a structure 5. This alternative substantially corresponds to the alternative in accordance with FIG. 14, the star-shaped elements having been turned around in each case, such that their limb running in a radial direction faces outward, that is to say away from the center 51.

FIG. 16 illustrates a further alternative of a structure 5 to be imaged. In accordance with this alternative, the structure 5 comprises eight star-shaped structure elements 18 arranged around a central pinhole. The star-shaped elements are arranged in particular on a circle having a diameter in the range of 4 µm to 6 µm. Five-pointed stars are involved. In this case, one respective point of each star faces radially toward the center 51. The structure in accordance with FIG. 16 has eight axes of symmetry.

Further advantageous properties of the test object 17, in particular of the structure 5 to be imaged, are described below. They apply generally independently of the specific shaping of the structure 5 to be imaged.

Even though this is not illustrated in the figures, provision can be made for the structure 5 to be imaged to have, in addition to the axially symmetrically embodied and arranged structure elements 18, additional structure elements having a symmetry breaking effect. Such additional structure elements can be embodied in particular in a pinhole-like fashion.

The structure 5 to be imaged is embodied in a compact fashion. It has, in particular, a circumcircle 52 having a diameter $d_U$ of at most 30 µm, in particular at most 20 µm, in particular at most 15 µm, in particular at most 10 µm, in particular at most 5 µm, in particular at most 3 µm. Such a compact embodiment of the structure 5 to be imaged makes it possible to measure the point spread function of an individual field position, for example of the optical axis, or of a set of different field positions. For measuring a plurality of different field positions, provision can advantageously be made for arranging a plurality of structures 5 to be imaged on the test object 17. This enables a parallelized, that is to say simultaneous, measurement of a plurality of field positions.

In this case, the individual structures 5 can be arranged in an array-like or matrix-like fashion. They can be arranged in particular in a grid of rows and columns. However, a Cartesian grid, in particular a Cartesian arrangement, need not be involved.

The individual structures 5 of the arrangement can be identical in each case. They can also be embodied differently.

The structures 5 of the test object 17 are arranged in particular in such a way that adjacent structures 5 have a minimum spacing which is in particular at least twice, in particular at least three times, in particular at least five times, in particular at least ten times, the magnitude of the respective largest diameter of the circumcircle du of the structures 5. The structures 5 have in particular a minimum spacing which ensures that their images in the maximum defocus positions do not overlap.

In accordance with one alterative provision is made for embodying the structure 5 in a field-filling fashion. Such a structure 5 makes it possible to measure a point spread function averaged over the size of the structure 5, in particular over a predefined field width.

Generally, it has been found that the precise sizes of the structures 5 can be determined in a simple manner in the focus. The fact that more parameters are required for the object description does not lead to decisive disadvantages.

In principle, it is also possible for the bar- or slit-shaped structure elements 18 to be formed by a multiplicity of pinholes arranged alongside one another. In this case, the indications concerning the larger dimension of the structure elements 18 as considered locally relate to the dimensions of the envelopes of the pinholes which form the respective structure element 18.

The test object 17 having the structure 5 to be imaged can be embodied as a transmission mask. However, it is likewise possible for the test object 17 to be embodied as a reflection mask. In this case, the structure elements 18 are embodied in a radiation-reflecting fashion.

The wavelength of the radiation source 3 substantially constitutes a scaling factor for the embodiment of the structure 5 to be imaged. In particular, the respective smallest dimension of the structure 5 to be imaged, as considered locally, scales linearly with the wavelength of the illumination radiation 8.

It has been established according to the invention that a sufficient illumination of high spatial frequencies in the pupil is achievable not only with amplitude masks but also by phase structures. It is possible, in particular, to produce a phase structuring such that a very extensively arbitrary pupil illumination can be generated. A gradation of the phase steps and/or the dimensioning thereof can be set as secondary condition in this case.

In order to laterally restrict the light flux, in order to make field measurements implementable or in order to illuminate just the isoplanatic patch of the projection optical unit 6, it is possible to embed the phase structuring into an opening, in particular a circular opening, or some other amplitude structure. However, this amplitude structure has no pupil-structuring function.

A further alternative is to embody the structure 5 to be imaged as a combined amplitude-phase shift mask. Such masks are also referred to as mixed or complex masks. The combination of amplitude and phase structures results in more degrees of freedom for the optimization of these structures. The structures 5 to be imaged are optimized in particular to the effect that they lead to the highest possible total transfer of the illumination radiation 8 and at the same time illuminate the pupil in a sufficiently structured manner. The weighted correlation of the Zernike polynomials on the pupil can be used as a quality criterion for the illumination of the pupil. The aim of the illumination is for the Zernike polynomials $Z_i$, $Z_j$ to be as far as possible uncorrelated with the illumination Pup as weight function up to a predefined order N. The following holds true, in particular: $|Cor(Pup*Z_i, Pup*Z_j)|<0.5$ i, j from $\{1, \ldots, N\}$; in particular $N \geq 16$, in particular $N \geq 25$, in particular $N \geq 36$.

A method for determining the imaging quality of the optical system 1 is described below. For determining the imaging quality of the optical system 1, the structure 5 to be imaged is put into the object-side focus of the projection optical unit 6 with the aid of the displacing and/or changing unit 16. It is arranged in particular in or in proximity to the object plane 10. A defocus image stack is then recorded via the measuring device 7. The defocus image stack is also referred to merely as image stack or focus stack, for simplification. The images of the image stack are preferably from a defocus region of ±3 Rayleigh lengths. The defocus image stack comprises, in particular, at least two images having different defocus positions. It can also comprise three, four, five, six or more images, in particular from respectively different defocus positions. Preferably, the defocus image stack comprises at least one intrafocal and at least one extrafocal image.

The defocus image stack can be achieved via a displacement of the measuring device 7 in the direction of the optical axis 9. It can also be generated, as already described, via a displacement of the structure 5 to be imaged in the direction of the optical axis 9. The manner in which the defocus image stack is generated must be taken into account in the later evaluation.

The defocus image stack is then used to deduce the phase distribution in the pupil. One of the following methods, in particular, can be provided for this purpose: an error reduction method (error reduction algorithm, also called IFTA or Gerchberg-Saxton algorithm), an optimization method or a direct inversion method. Each of these types of algorithm has different prerequisites for its applicability and different limitations. The most suitable algorithm in each case can be chosen as necessary.

Some details of these methods are described more specifically below.

The error reduction method is an iterative process (see FIG. 19). Firstly, an initial pupil function 20 and an initial E-field stack 21 are predefined. The further process involves transferring back and forth alternately between pupil and different planes of the image space. Within the corresponding space, pupil space and image space, respectively, a replacement of the transferred data with the known measurement data or design data is then carried out in each case. If the algorithm converges, then the retrieved pupil function generates the intensity grading of the measurement.

Concerning the individual steps:

In an iterative loop 22, a pupil function 23 is transferred into an extended E-field stack 25 in a first transfer step 24. The transfer function used is $H^{Pupil\_Image}$, the optical transfer function between the pupil of the projection optical unit 6 and the image space.

The calculated field amplitudes are then replaced with the measured field amplitudes in a first replacement step 26. The first replacement step 26 is in some instances also designated by the function R.

After the first replacement step 26, an E-field stack 27 is present, which is transferred into an extended pupil function 29 in a second transfer step 28. The second transfer function used is the inverse of the optical transfer function between the pupil of the projection optical unit 6 and the image space, $(H^{Pupil\_Image})^{-1}$. A prerequisite for the application of the error reduction algorithm is, therefore, that the inverse function with respect to $H^{Pupil\_Image}$ is known.

In a trimming step 30, which is also designated by a function T, the extended pupil function 29 is then trimmed on the pupil boundary, that is to say adapted to the boundary conditions.

There are different variants of such error reduction algorithms, which differ in the structure of the functions T and R for replacing the calculated field amplitudes with the measured field amplitudes, on the one hand, and for trimming the pupil function on the pupil boundary, on the other hand. The replacements and trimmings, respectively, can be carried out such that the field amplitudes and the pupil boundary, respectively, completely correspond to the desired state. In various hybrid variants, however, the replacements are not effected completely, rather a mediation between the extended variables and the measurement states takes place.

The algorithm is stopped either if a sufficient number of iterations have been carried out, or if the influences of the functions T and R vanish, that is to say when a specific convergence criterion is reached.

The result is an E-field resolved pixel by pixel.

The error reduction algorithm is appropriate particularly in the case of coherent illumination. In such a case, with paraxial approximation, the optical transfer function $H^{Pupil\_Image}$ corresponds to a possibly scaled Fourier transformation. The inverse function, $(H^{Pupil\_Image-1})$, then corresponds to an inverse possibly scaled Fourier transformation.

A further prerequisite for the applicability of the error reduction algorithm is that neither the system pupil nor the spectrum of the object has zeroes. Otherwise, the phase is indeterminable at these locations.

A deconvolution is required in the case of incoherent illumination.

Appropriate optimization methods include, for example, a least-square fit, a Levenberg-Marquardt method, a simplex method or similar methods. A modal optimization method is involved, in particular. Such a method is based on a parameterizable model for the variable sought, in the present case in particular for the system aberrations. An optimization algorithm is then used to determine the parameters which best describe the system. In other words, the pupil function has to be parameterized. For parameterizing the pupil function, the phase distribution in the pupil can be decomposed into Zernike polynomials, for example.

A modal method for determining the pupil function is described below with reference to FIG. 20. Proceeding from the provision of an initial parameter vector 31, a model description 33 of the projection optical unit 6 is developed in a first modeling step 32. In a transfer step 34, the optical transfer function, $H^{Pupil\_Image}$, is applied to the model description 33 in order to generate a simulated image stack 35.

In a subsequent comparison step 36, the simulated image stack is compared with the image stack recorded by the measuring device 7 in order to improve the parameter vector 37. The latter is used for refining the model description 33 in a subsequent modeling step 38.

The merit or target function of the optimization algorithm is also formed in the comparison step 36. The optimization algorithm is continued until the merit function attains a predefined value: that is to say until the simulated image stack 35 is similar enough to the image stack actually recorded.

One prerequisite for such a modal method is that the desired field can be described by a parameterized model.

In the case of a direct inversion method, the aim is to deduce the result directly from the measurement. For this purpose, there are the following two possibilities, in particular: algorithmic solutions and database solutions.

In the case of algorithmic solutions, an algorithm exists for calculating directly, non-iteratively, the desired field or the desired parameters from the image stacks recorded via the measuring device 7. By way of example, the Extended Nijboer Zernike algorithm serves as an example of such an algorithm. This algorithm is useful particularly in the case of a substantially punctiform radiation source 3.

In the case of the database solutions, a multiplicity of parameter combinations are forward simulated and a resulting images together with the underlying parameter sets are stored in a database. The data can also be compressed algorithmically, in particular via a principal component analysis. In a measurement carried out subsequently, a comparison with this database is then carried out and the parameter vector is used which generates the image stack which is closest to the one actually measured, or an interpolation of the parameter vectors of the closest solutions is effected. The quality of the parameter estimation correlates directly with the density of the simulated parameter sets.

In all of the methods described above, the phase distribution in the pupil can be developed as necessary according to the image aberrations sought, for example according to Zernike polynomials, use being made of the precise knowledge about the properties of the structure 5 to be imaged. The pupil function, that is to say the radiation distribution in the pupil, results from the spectrum of the structure 5 to be imaged and the system transfer function.

Moreover, it is advantageous for the extraction of the image aberrations if the latter are unambiguously extractable from the pupil phase surface. This is ensured by the specific design of the structure 5 to be imaged.

A further alternative of the optical system 1 is described below with reference to FIG. 17. Identical parts are given the same reference signs as in the exemplary embodiments described above, to the description of which reference is hereby made. As in the case of the exemplary embodiment in accordance with FIG. 1, the optical system 1 comprises an illumination device 2 having a radiation source 3 for generating illumination radiation 8. The optical system 1 furthermore comprises the structure 5 to be imaged, the projection optical unit 6 and the measuring device 7. An intrafocal image position 39 and an extrafocal image position 40 are illustrated by way of example in FIG. 17.

As already outlined, during traditional phase retrieval it is necessary to record a defocus stack of the structure 5 to be imaged. In this case, a defocus region of at least ±3 Rayleigh lengths around the image plane 11 is recommendable in order to obtain enough information about the pupil function. The maximum intensity within the caustic surface falls, however, with the square of the distance to the focus. An increased noise should therefore be expected in the highly intrafocal and extrafocal regions.

It has been recognized according to the invention that a diversification can be realized not exclusively via a defocus. Rather, any manipulation within the pupil function which varies the individual parts of the pupil, that is to say the frequencies in the space domain, is a potential diversification. Such diversifications which vary the pupil function in as broadband a manner as possible are advantageous.

As mechanism for varying the illumination distribution in the pupil of the projection optical unit 6, the optical system 1 in accordance with FIG. 17 comprises a pupil manipulation mask 41. The pupil manipulation mask 41 is embodied as a phase shift mask, an amplitude mask or a combined phase shift-amplitude mask.

The pupil manipulation mask 41 is arranged in a pupil plane 43 of the projection optical unit 6 or in proximity to the pupil plane 43 via a displacing and/or changing unit 42.

The pupil manipulation mask 41 can be displaced and/or exchanged via the displacing and/or changing unit 42. It is shiftable in particular linearly, in particular in a direction perpendicular to the optical axis 9, and/or rotatable about the optical axis 9.

In other words, a pupil diversification is possible with the aid of the pupil manipulation mask 41. One major advantage of such a pupil diversification is that a rapid retrieval can be carried out, without the need for a defocusing of the measuring device 7 or of the structure 5 to be imaged. All that is required for this purpose is physical access to the pupil plane of the projection optical unit 6.

A further advantage of the pupil diversification is that it can be carried out for both coherent and incoherent illumination without a loss of accuracy. As a result, it becomes possible to significantly improve the signal-to-noise ratio in the case of non-coherent illumination.

A phase shift mask, in particular, is suitable as the pupil manipulation mask 41. Such a phase shift mask does not change the total radiation transfer of the optical system 1. Such a phase shift mask is always invertible. The phase shift mask can be used to diversify the point image series without defocusing the measuring device 7. The phase shift mask can be used, in particular, to cancel the ambiguity of the phase reconstruction.

One example of a pupil manipulation mask 41 which is embodied as a phase plate and which is shifted linearly via the displacing and/or changing unit 42 is illustrated in six different insertion positions in FIGS. 21a to f. Two point image series corresponding thereto, which were recorded with an intrafocal and an extrafocal positioning of the measuring device 7, are illustrated in FIGS. 22 and 23.

The corresponding optical system 1 had a radiation source 3 having illumination radiation 8 having a wavelength of 632 nm and a numerical aperture of 0.4. The measuring device 7 had a pixel size having a diameter of 1 µm.

In FIGS. 22 and 23, a simple pinhole served as the structure 5 to be imaged. However, the pupil diversification is also advantageously combinable with the specific embodiment of the structure 5 to be imaged in accordance with the description above.

In principle, it is also possible to keep the measuring device 7 in a single position. In this case, the measuring device 7 can be arranged intrafocally, extrafocally or in the region of the image plane 11. All that is essential is that the effect of the pupil manipulation is visible.

A further example of a pupil manipulation mask 41 in six different rotation positions is illustrated in FIG. 24. In this example, the pupil manipulation mask 41 comprises an amplitude gap 44, which is rotatable with the aid of the displacing and/or changing unit 42.

FIG. 25 shows a pupil manipulation mask having a phase gap 45, which is mounted rotatably with the aid of the displacing and/or changing unit 42.

It goes without saying that the pupil manipulation mask 41 can also be embodied as a combined amplitude-phase shift mask. The examples illustrated in FIGS. 21a to f, 24 and 25 serve to elucidate the concept of pupil diversification via a variation of the illumination distribution in the pupil with the aid of the pupil manipulation mask 41. The structure of the mask can be optimized with regard to the optical system 1 to be measured, in particular the projection optical unit 6, and/or with regard to specific imaging aberrations to be measured.

In the case of the embodiment of the pupil manipulation mask 41 as an amplitude mask, the total transfer, in particular the total transmission of the optical system 1, is reduced. This must be taken into account within an error reduction algorithm as a boundary condition of the illumination in the pupil. In contrast to general phase shift masks, however, amplitude masks are easier to produce and align.

The diversification of the pupil can be achieved both by exchanging the pupil manipulation mask 41 and by displacing, in particular linearly shifting and/or rotating one and the same pupil manipulation mask 41.

As already described, a beam splitter 15 can be provided in order to be able to record images simultaneously from intra- and extrafocal positions.

A further alternative of an optical system 1 having a mechanism for varying the illumination distribution in the pupil is described below with reference to FIG. 18. Identical parts are given the same reference signs as in the case of the system in accordance with FIG. 17 to the description of which reference is hereby made.

In this exemplary embodiment, the optical system 1 comprises a mechanism for object diversification. Instead of a manipulation within the pupil, here the object 46 to be imaged is varied. This leads indirectly to a manipulation of the pupil. The object 46 to be imaged is held via a displacing and/or changing unit 47. With regard to the displacing and/or changing unit 47, reference should be made to the description of the displacing and/or changing unit 16 or 42. The object 46 to be imaged is arranged displaceably and/or exchangeably in the beam path. In particular, it is displaceable in a direction perpendicular to the optical axis and/or rotatable about the optical axis 9. The above-described test object 17 having the structure 5 to be imaged can serve as the object 46 to be imaged.

The object 46 to be imaged is arranged in particular in the region of the object plane 10 or in proximity thereto.

The variation of the object 46 to be imaged, in particular by exchange and/or displacement, is also referred to as object diversification. One major advantage of object diversification in comparison with pupil diversification is that it can also be applied to optical units in which the pupil plane 43 is not freely accessible.

The object diversification is preferably carried out with coherent illumination.

However, the use of only partially coherent or incoherent illumination radiation 8 is also possible. In this case, the imaging of the intensity is an intensity-wise superposition of shifted point spread functions. In the paraxial case, it can be calculated via a convolution of the point spread function with the object or the object spectrum. In this case, it is advantageous if the object 46 to be imaged is structured in such a way that the diffraction structures of the point spread function are not blurred to an excessively great extent by the convolution.

It goes without saying that the different aspects of the invention, in particular the two-dimensionally extended embodiment of the structure 5 to be imaged, the concept of pupil diversification and the concept of object diversification, can be combined with one another in any desired way.

The invention claimed is:

1. A test object, comprising:
    a structure comprising a plurality of imageable structure elements,
    wherein:
        the test object is configured to measure a point spread function of an optical system having an Airy diameter;
        for each imageable structure element:
            the imageable structure element has an extent that is greater than the Airy diameter along a first direction; and
            the imageable structure element has an extent that is less than the Airy diameter along a second direction different from the first direction;
        the imageable structure elements are configured so the structure has at least two axes of symmetry; and
        the imageable structure elements are configured so that the structure has an even-order radial symmetry of an order of at least four.

2. The test object of claim 1, wherein the structure comprises at least four imageable structure elements.

3. The test object of claim 1, wherein a subset of the imageable structure elements is configured in a bar-shaped fashion.

4. The test object of claim 1, wherein a subset of the imageable structure elements is configured in a slit-shaped fashion.

5. The test object of claim 1, wherein the structure has a surface area that is at least 20 times a magnitude of a square of the Airy diameter of the optical system.

6. The test object of claim 1, wherein the structure comprises a phase shift mask.

7. The test object of claim 1, wherein the structure comprises an amplitude mask.

8. The test object of claim 1, wherein the test object comprises a plurality of structures, and each structure comprises a plurality of imageable structure elements.

9. A device, comprising:
    a test object according to claim 1;
    a camera configured to record a focus stack.

10. A method, comprising:
    providing a test object according to claim 1; and
    recording a focus stack having at least two images of the test object in different defocus positions.

11. The method of claim 10, comprising using a camera to record the focus stack.

12. The method of claim 10, comprising recording images in defocus positions of a Rayleigh length with an integration time of at most 20 ms.

13. The method of claim 10, comprising recording a portion of the images of the focus stack multiple times.

14. The method of claim 10, comprising recording the images of the focus stack with an integration time which varies by at most a factor of 10 for two different defocus positions.

15. The method of claim 10, comprising ascertaining the point spread function of the optical system in parallel fashion position by position for a plurality of field positions.

16. A method comprising:
    imaging a plurality of structure elements of a structure of a test object to determine a point spread function of an optical system having an Airy diameter,
    wherein:
        each structure element has an extent that is greater than the Airy diameter along a first direction;
        each structure element has an extent that is less than the Airy diameter along a second direction which is different from the first direction;
        the plurality of structure elements are configured so the structure has at least two axes of symmetry; and
        the imageable structure elements are configured so that the structure has an even-order radial symmetry of an order of at least four.

* * * * *

UNITED STATES PATENT AND TRADEMARK OFFICE
CERTIFICATE OF CORRECTION

PATENT NO. : 9,797,805 B2  
APPLICATION NO. : 14/707533  
DATED : October 24, 2017  
INVENTOR(S) : Lars Stoppe, Robert Pomraenke and Michael Arnz Page 1 of 1

It is certified that error appears in the above-identified patent and that said Letters Patent is hereby corrected as shown below:

In the Specification

Column 4, Line 16, delete "$d_{Airy} = 1.22\ \pi\ /\ NA$," and insert -- $d_{Airy} = 1.22\ \lambda\ /\ NA$, --.

Signed and Sealed this  
Nineteenth Day of December, 2017

Joseph Matal  
*Performing the Functions and Duties of the*  
*Under Secretary of Commerce for Intellectual Property and*  
*Director of the United States Patent and Trademark Office*